(12) United States Patent
Haschke et al.

(10) Patent No.: US 6,909,932 B2
(45) Date of Patent: Jun. 21, 2005

(54) METHOD FOR WAFER POSITION DATA RETRIEVAL IN SEMICONDUCTOR WAFER MANUFACTURING

(75) Inventors: Silka Haschke, Pliening (DE); Andreas Wintergerst, Dresden (DE)

(73) Assignee: Infineon Technologies, Dresden (DE)

( * ) Notice: Subject to any disclaimer, the term of this patent is extended or adjusted under 35 U.S.C. 154(b) by 291 days.

(21) Appl. No.: 10/368,073

(22) Filed: Feb. 18, 2003

(65) Prior Publication Data

US 2003/0144757 A1 Jul. 31, 2003

Related U.S. Application Data

(63) Continuation of application No. PCT/EP01/08900, filed on Aug. 1, 2001.

(30) Foreign Application Priority Data

Aug. 17, 2000 (EP) .............................................. 00117733

(51) Int. Cl.[7] .............................................. G06F 19/00
(52) U.S. Cl. ....................... 700/121; 700/104; 700/110; 438/5
(58) Field of Search .......................... 700/97, 100, 104, 700/110, 115, 117, 120, 121; 438/584, 649, 5–13

(56) References Cited

U.S. PATENT DOCUMENTS

| | | | | |
|---|---|---|---|---|
| 5,761,065 A | * | 6/1998 | Kittler et al. ................ | 700/117 |
| 5,930,138 A | * | 7/1999 | Lin et al. ..................... | 700/108 |
| 6,259,960 B1 | * | 7/2001 | Inokuchi ...................... | 700/110 |
| 6,684,125 B2 | * | 1/2004 | Kahn et al. .................. | 700/218 |
| 6,751,517 B1 | * | 6/2004 | Chou et al. .................. | 700/121 |
| 2003/0138978 A1 | * | 7/2003 | Tanaka et al. ................ | 438/5 |

FOREIGN PATENT DOCUMENTS

| | | |
|---|---|---|
| DE | 199 62 703 A1 | 7/2000 |
| JP | 08268512 | 10/1996 |

OTHER PUBLICATIONS

Author not listed: "Sorting and Transfer Drive Mechanism", IBM Technical Disclosure Bulletin, vol. 33, No. 6A, Nov. 1990, pp. 134–143.

* cited by examiner

*Primary Examiner*—Leo Picard
*Assistant Examiner*—Douglas S. Lee
(74) *Attorney, Agent, or Firm*—Laurence A. Greenberg; Werner H. Stemer; Ralph E. Locher

(57) ABSTRACT

Semiconductor products, especially semiconductor wafers, are processed according to a defined sequence of orders with the products arranged in a container. Product processing data of product processing steps are stored with reference to product position data identifying product positions in the product containers. When the position of products in a container is required, a product handling order is defined and integrated in the predefined sequence of orders thereby resulting in an extended sequence of orders. The product processing steps and the product handling step are executed in compliance with the extended sequence of orders and product position change data are stored. All slot-related semiconductor processing information are thereby automatically brought in conformity with the actual material flow in cases where handling steps are executed that change the semiconductor positions upon irregular processing execution.

11 Claims, 1 Drawing Sheet

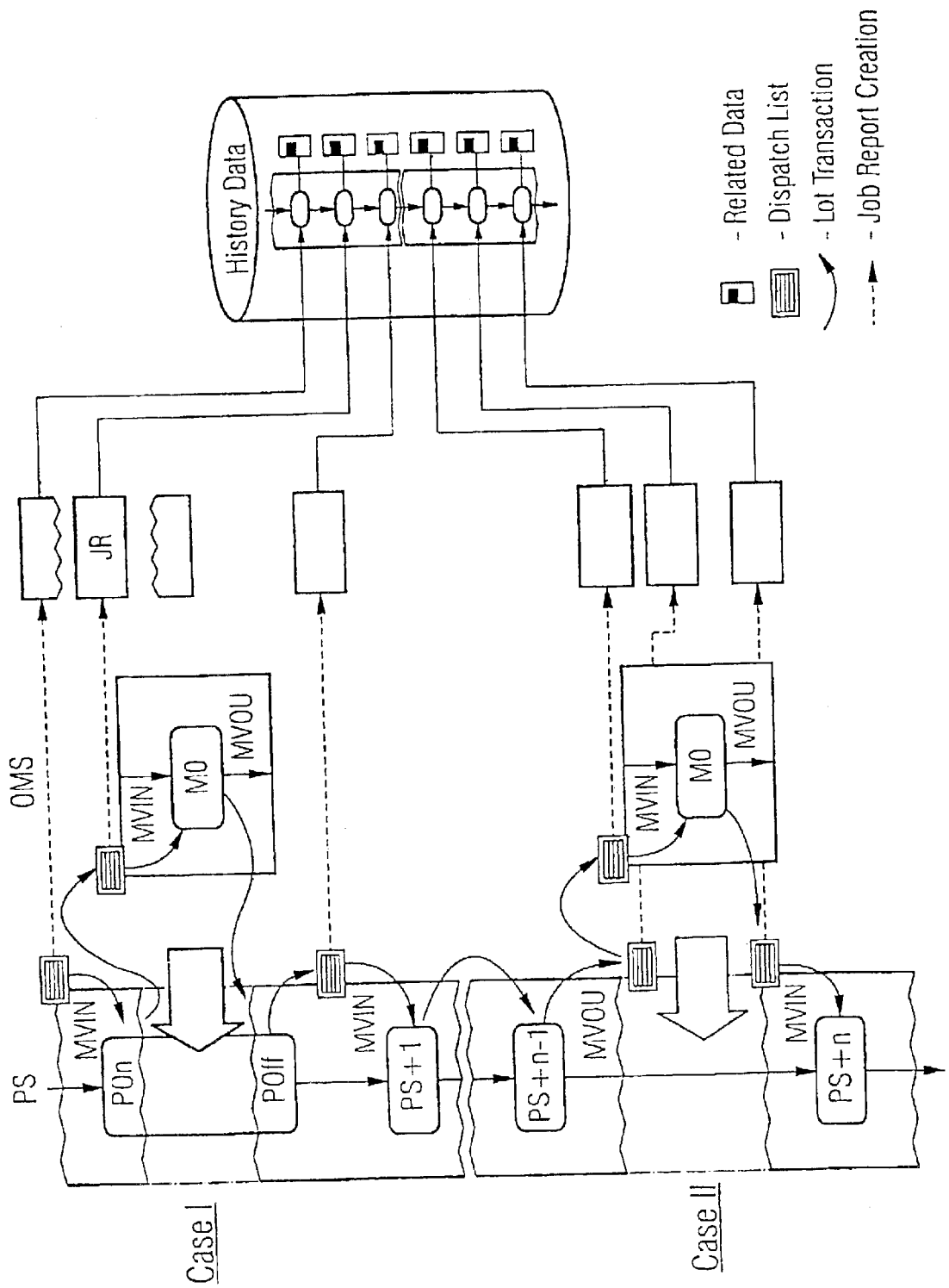

METHOD FOR WAFER POSITION DATA RETRIEVAL IN SEMICONDUCTOR WAFER MANUFACTURING

CROSS-REFERENCE TO RELATED APPLICATION

This application is a continuation of copending International Application No. PCT/EP01/08900, filed Aug. 1, 2001, which designated the United States and was published in English.

BACKGROUND OF THE INVENTION

Field of the Invention

The invention pertains to a method for processing semiconductor products by predefining a sequence of orders and executing product processing steps by product processing tools, during regular processing the product processing steps being executed in compliance with the predefined sequence of orders, wherein multitudes of semiconductor products to be processed are transported in product containers, and wherein product processing data of product processing steps are stored with reference to product positions in the product containers and to product identification codes.

Such a method is commonly use in the semiconductor industry. Often hundreds of processing steps are performed during the manufacture of integrated circuits. Integrated circuits are arranged on a semiconductor wafer, which has a unique wafer identification code (ID).

A great number of processing tools is required for the execution of deposition steps, patterning steps, doping steps or etching steps on respective tools, for instance. The equipment and the operating personnel controlling the equipment are working in a cleanroom environment to avoid particle contamination of the semiconductor products.

Within the cleanroom, the semiconductor products are manually or automatically transported to the respective processing tools. As in most cases groups of several wafers are transported together in a container, e.g. a SMIF pod or a FOUP (Front Opening Unified Pod), usually a multitude of wafers are subjected to the respective processing step. In order to evaluate the results of the processing steps, processing data are stored together with the information indicating the position and identification code (ID) of each wafer in a container. Due to the great number of hundreds of processing steps performed in sequence, it is very important to store all position data identifying all wafer positions in the containers from the beginning to the end of wafer processing. The main benefit of this storage is the possibility of retrieving the information of wafer location and identification when improper processing performance has occurred. Systems for the automatic transport of semiconductor products are described, for example, in German published patent application DE 199 62 703 A1 and in *Sorting and Transfer Drive Mechanism*, IBM Technical Disclosure Bulletin, US, IBM Corp. New York, vol. 33, Nr. 6A, November 1990.

Due to complex processing procedures, very often handling steps for changing the number of the position of the wafers in the containers are required. For instance, a certain number of wafers in a container have to be separated from the others by reasons of processing plans or other circumstances. As the processing tools are not able to change the number or the position of the wafers in the containers, handling devices like mappers are provided in the cleanroom. Whenever a mapping step is required, the respective container is transported to one of the mappers, the mapping step is executed and the container is transported to the next processing tool. According to prior art, the transport to and from the mapping devices is performed manually by the operating personnel.

Whenever a mapping step is performed according to the processing plan, the wafer positions in a container have been altered, and the processing data no longer correspond to the former arrangement of the wafers. However, as the process plan is created in advance, such handling steps are foreseeable, and proper processing data rearrangement can be programmed in advance. Thus, any handling step foreseeable from the beginning of the process plan does not seriously affect the possibilities of processing data retrieval.

Apart from regular handling steps, at any time an unplanned handling step may become necessary by reasons of improper processing performance, for instance. Due to the complexity of modern semiconductor manufacture, the necessity of performing an additional handling operation arises with increasing probability. The handling operation as such may be performed in the same manner as the regular handling steps at any stage of the process plan. However, as the need and the moment of this unplanned handling step within the entire process flow cannot be foreseen, any further processing data are attributed to incorrect wafer positions within a carrier. As a consequence, processing data as well as wafer position data must be rearranged afterwards for proper wafer history information retrieval. The present invention relates to these irregularly performed handling steps.

SUMMARY OF THE INVENTION

It is accordingly an object of the invention to provide a wafer position data retrieval method in the manufacture of semiconductor wafers which overcomes the above-mentioned disadvantages of the heretofore-known devices and methods of this general type and which, first, obviates the need for such subsequent data rearrangement necessary according to prior art when unplanned handling steps are required.

Furthermore, with increasing demands on cleanroom quality, any atmospheric contact of semiconductor products and operating personnel—even when working under cleanroom conditions—have to be avoided. To this end, a mini-environment of very high cleanroom quality is provided within a cleanroom of minor quality. The operating personnel are working within the latter, whereas the processing tools and the transport machinery to and from the processing tools are allocated within the high quality mini-environment. As a consequence of the mini-environmental cleanroom demands, manual handling of the wafers is no longer executable. Mapping devices have to be used. Hence, it is a second object of the present invention to avoid any contact between equipment in mini-environment and operation personnel out of mini-environment in the case that an unplanned handling step must be executed.

With the foregoing and other objects in view there is provided, in accordance with the invention, a method for processing semiconductor products, which comprises:

predefining a sequence of orders and executing product processing steps with product processing tools;

during regular processing, executing the product processing steps in compliance with the predefined sequence of orders;

thereby transporting a multiplicity of products to be processed in product containers; and storing product processing data of product processing steps with reference to product position data identifying product positions in the product containers and to product identification codes;

upon improper processing performance requiring an unforeseen product handling step of changing one of a number and a position of a semiconductor product in one or more product containers:

defining a product handling order and integrating the product handling order in the predefined sequence of orders, to form an extended sequence of orders;

executing the product processing steps and the product handling step in compliance with the extended sequence of orders; and storing product position change data corresponding to the integrated product handling step.

These objects are achieved by defining, upon irregular processing requiring a product handling step of changing the number and/or the position of semiconductor products in one or more product containers, a product handling order and integrating it in the predefined sequence of orders, thereby resulting in an extended sequence of orders, by executing the product processing steps and the product handling step in compliance with the extended sequence of orders, and by storing product position chance data when the integrated product handling step is executed.

In contrast to prior art, processing methods requiring final data rearrangement for proper wafer history retrieval, it is the general idea of the present invention to influence the underlying process plan itself, whenever an unplanned handling step is required. Instead of executing the additional handling step separately, that is without any correspondence in the process plan, it is proposed to redefine the original process plan resulting in a new lot specific instance of the process plan now containing orders for the additional handling step, too.

With reference to the features of claim 1, a sequence of orders is predefined before executing product processing, and as long as the semiconductor products are processed regularly, the processing steps are executed in compliance with this predefined sequence of orders. When irregular processing requires an additional product handling step, this sequence is redefined. In a simple case, this redefinition is performed by defining a product handling order and integrating it into the predefined sequence of orders, thereby resulting in an extended sequence of orders. All subsequent processing steps as well as the additional product handling step are executed in compliance with the extended sequence of orders, which may result from the original sequence of orders by varying the chronological succession of processing steps, splitting single processing steps, inserting additional steps or more complex product treatment procedures, nesting template nodes and so on. In any case, the additional handling step is performed in accordance with the product handling order integrated in the amended process plan, and product position change data corresponding to this handling step are stored. As a consequence, the system now is able to record all wafer position rearrangements, because each unplanned handling step is included in the final sequence of orders. It is now possible to assign the exact final processing data to each single wafer.

Furthermore, so manual interference of operating personnel is required for performing unplanned handling steps, because—as the operating personnel merely has to redefine the sequence of orders—the mapping device can be joined with the processing tools and an existing transport system, that is with the complete equipment, which is provided within the mini-environmental cleanroom atmosphere, and which automatically executes any sequence of orders one programmed.

The present invention allows flexible reaction on any process complication requiring other order sequences than initially predefined. Upon irregular processing, the amended order sequence can be extended in turn. In any case, the resulting actual product flow is in conformity with the product flow resulting from the order sequence.

As at least the defined product handling order is integrated in the existing sequence of orders, two preferred embodiments concern the way of its integration.

First, the product handling order can be inserted between two product processing orders of the predefined sequence. That is, it is inserted like an additional product processing order. This embodiment is preferred especially when no urgent actions are required upon irregular wafer processing.

Second, the product handling order can be inserted after partial execution of a product processing step being interrupted, thereby creating an order for residual execution of the interrupted product processing order. According to this embodiment, the order for the unplanned handling step is nested in two parts of the single product processing order, which is recommendable when immediate action is required to save wafers not yet processed from disadvantageous process operation.

Whereas in simplest case of redefinition of the predefined sequence of orders according to the invention, a single handling step, that is the step performed by a device not actually processing the products, is inserted in the process plan of product processing orders, according to preferred embodiments further product processing orders are defined and integrated in addition. These further product processing orders may be template process nodes instanciable at any time when required by reasons of irregular process execution. According to a preferred embodiment, the further product processing orders are reprocessing orders serving to restore a processing stage before disadvantageous processing, for instance to remove, in semiconductor industry, a distortedly patterned lithographic structure of a deposited layer.

According to a further embodiment, the orders are executed by a multitude of product processing tools, and handling orders are defined in such a way that they are executable by anyone of the handling devices. According to another preferred embodiment, at each process tool operating personnel is capable of defining and integrating the handling order executable by any handling device.

These embodiments allow for remote definition and execution of handling steps within current complex large-scale manufacturing. Especially there is no need that an operator defining handling orders must also—in cases still required—accompany the handling step at the respective handling device.

According to further embodiments related to semiconductor industry, the semiconductor products are semiconductor products arranged in respective slots of the containers. The handling step is performed by a mapper of a sorter, capable of performing splitting, merging, sorting or transferring operations, for instance. The products to be handled may preferably be semiconductor wafers.

Due to the benefit of the invention of consistent data collection with regard to position data and wafer ID preferably processing data and position data are stored for each single semiconductor product in a semiconductor history data file.

Other features which are considered as characteristic for the invention are set forth in the appended claims.

Although the invention is illustrated and described herein as embodied in a method for wafer position data retrieval in semiconductor wafer manufacturing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a diagrammatic system layout of the invention, including a descriptive legend.

DESCRIPTION OF THE PREFERRED EMBODIMENTS

Referring now to the sole FIGURE of the drawing in detail the schematic illustrates a sequence of processing steps PS representing a process plan that is quite complex in reality. The sequence of orders contains a first processing step PS, interrupted upon irregular processing, as well as process steps PS+1 ... PS+n-1 and PS+n. Two excerpts of the sequence of orders, denoted as case I and case II, illustrate two preferred embodiments of the invention. They refer to two different ways of integrating unplanned optional mapping steps OMS. According to case I, the first part POn of a processing step is interrupted upon irregular processing execution, and a mapping order MO is defined and inserted, thereby creating an order POff for residual execution of the interrupted product processing order to be executed after the mapping order. After residual execution of the interrupted processing step PS (interrupted for the purpose of performing the MO between the triggers POn, POff), the next process step PS+1 is executed. At each processing tool, a dispatch list with orders to be executed is stored, and semiconductor products corresponding to data in the dispatch list are transported to the respective processing tool by a transport system. The semiconductor products are transported in groups of one or several lots in containers such as front opening unified pots, for instance, with several slots, each slot receiving a single semiconductor wafer. Every processing and mapping order is initiated and concluded by respective move-in and move-out sub-orders MVIN and MVOU.

According to case II, a mapping order is integrated in the sequence of orders by insertion between two processing orders PS+n-1 and PS+n.

By integrating mapping orders and, if required, further processing orders, into the order sequence before executing subsequent orders, in any case the slot related wafer position data are retrievable. In order to use the benefit of the present invention, for every process step and mapping step, a job report JR is created and filed in a database containing history data of every single wafer. The history data contain all relevant processing data as well as the position data of the wafer, that is number of the slot of the front opening unified pod and the identification of the unified pod.

The history data contain all information required for gapless slot and wafer ID related wafer tracking from the beginning to the end of the processing root. According to prior art, the history data did not correspond to the actual wafer positions after diverse handling steps manually performed upon irregular processing, and hence had to be rearranged. According to the above-described invention, these disadvantages have been resolved and it is possible, with the invention, to provide for historical data that correspond to the actual wafer position.

We claim:

1. A method for processing semiconductor products, which comprises:
   predefining a sequence of orders and executing product processing steps with product processing tools;
   during regular processing, executing the product processing steps in compliance with the predefined sequence of orders;
   thereby transporting a multiplicity of products to be processed in product containers; and
   storing product processing data of product processing steps with reference to product position data identifying product positions in the product containers and to product identification codes;
   upon improper processing performance requiring an unforeseen product handling step of changing one of a number and a position of a semiconductor product in one or more product containers:
      defining a product handling order and integrating the product handling order in the predefined sequence of orders, to form an extended sequence of orders;
      executing the product processing steps and the product handling step in compliance with the extended sequence of orders; and
      storing product position change data corresponding to the integrated product handling step.

2. The method according to claim 1, which comprises inserting the product handling order between two product processing orders of the predefined sequence of orders.

3. The method according to claim 1, which comprises inserting the product handling order after partial execution of a product processing step being interrupted, thereby creating an order for residual execution of the interrupted product processing order.

4. The method according to claim 1, which comprises defining further product processing orders and integrating the further product processing orders in the order list together with the product handling order.

5. The method according to claim 4, wherein the further product processing orders are product reprocessing orders.

6. The method according to claim 1, which comprises executing the orders with a multitude of product processing tools and handling devices, and defining handling orders to be executable by anyone of the handling devices.

7. The method according to claim 6, which comprises remotely defining and executing handling steps to render an operator at each processing tool capable of defining and integrating the handling order executable by any handling device.

8. The method according to claim 1, wherein that the semiconductor products are semiconductor wafers arranged in respective slots of the product containers.

9. The method according to claim 1, wherein the handling step is performed by a mapper or a sorter.

10. The method according to claim 9, wherein the handling step is at least one of a splitting, merging, sorting, and transferring operation.

11. The method according to claim 1, which comprises storing processing data and position data for each semiconductor product in a semiconductor history data file.

* * * * *

UNITED STATES PATENT AND TRADEMARK OFFICE
CERTIFICATE OF CORRECTION

PATENT NO. : 6,909,932 B2  
DATED : June 21, 2005  
INVENTOR(S) : Silka Haschke et al.

It is certified that error appears in the above-identified patent and that said Letters Patent is hereby corrected as shown below:

Title page,
Item [73], Assignee, should read as follows:
-- Infineon Technologies SC300 GmbH & Co. KG, Dresden (DE) --.

Signed and Sealed this

Sixth Day of September, 2005

JON W. DUDAS
*Director of the United States Patent and Trademark Office*